(12) United States Patent
Maruyama

(10) Patent No.: US 10,014,795 B2
(45) Date of Patent: Jul. 3, 2018

(54) POWER CONVERTER

(71) Applicant: FUJI ELECTRIC CO., LTD., Kanagawa (JP)

(72) Inventor: Koji Maruyama, Tokyo (JP)

(73) Assignee: FUJI ELECTRIC CO., LTD. (JP)

(*) Notice: Subject to any disclaimer, the term of this patent is extended or adjusted under 35 U.S.C. 154(b) by 0 days.

(21) Appl. No.: 15/658,465

(22) Filed: Jul. 25, 2017

(65) Prior Publication Data

US 2018/0062532 A1   Mar. 1, 2018

(30) Foreign Application Priority Data

Sep. 1, 2016   (JP) .................................. 2016-171287

(51) Int. Cl.
| | |
|---|---|
| *H01L 23/538* | (2006.01) |
| *H02M 7/00* | (2006.01) |
| *H02M 7/537* | (2006.01) |
| *H01L 25/11* | (2006.01) |

(52) U.S. Cl.
CPC ........ *H02M 7/003* (2013.01); *H01L 23/5383* (2013.01); *H01L 23/5386* (2013.01); *H01L 25/115* (2013.01); *H02M 7/537* (2013.01)

(58) Field of Classification Search
CPC .. H02M 2001/0003; H02M 7/42; H02M 7/44; H02M 7/48; H02M 7/483; H02M 7/487; H02M 7/537; H01L 23/538; H01L 23/5383; H01L 25/5386; H01L 25/115
See application file for complete search history.

(56) References Cited

U.S. PATENT DOCUMENTS

2013/0175682 A1* 7/2013 Itaya ..................... H01L 21/563
257/737
2014/0334203 A1* 11/2014 Honda .................. H02M 7/003
363/56.12

(Continued)

FOREIGN PATENT DOCUMENTS

JP   2010-252490 A   11/2010

*Primary Examiner* — Emily P Pham
*Assistant Examiner* — Shahzeb K Ahmad
(74) *Attorney, Agent, or Firm* — Ostrolenk Faber LLP

(57) ABSTRACT

A power converter in which a plurality of semiconductor switches are connected to a plurality of drive circuits configured to control states of the semiconductor switches includes a first semiconductor switch, a second semiconductor switch, a first drive circuit, a second drive circuit, and a multilayer substrate in which a first wiring, and a second wiring are disposed. In the multilayer substrate, a reference potential wiring and a control signal wiring of the first wiring are disposed in different layers at positions overlapping in a substrate lamination direction, a reference potential wiring and a control signal wiring of the second wiring are disposed in different layers at positions overlapping in the lamination direction, and a wiring length of a portion in which the first wiring and the second wiring overlap in the lamination direction is set to be shorter than either a wiring length of a portion in which the reference potential wiring and the control signal wiring of the first wiring overlap in the lamination direction or a wiring length of a portion in which the reference potential wiring and the control signal wiring of the second wiring overlap in the lamination direction.

5 Claims, 7 Drawing Sheets

(56) References Cited

U.S. PATENT DOCUMENTS

| | | | |
|---|---|---|---|
| 2015/0214857 A1* | 7/2015 | Kosuga | H02M 7/003 |
| | | | 318/400.26 |
| 2016/0133301 A1* | 5/2016 | Fukushi | G11C 5/147 |
| | | | 365/51 |
| 2016/0218076 A1* | 7/2016 | Managaki | H01L 21/486 |
| 2016/0322341 A1* | 11/2016 | Inagaki | H01L 25/18 |

* cited by examiner

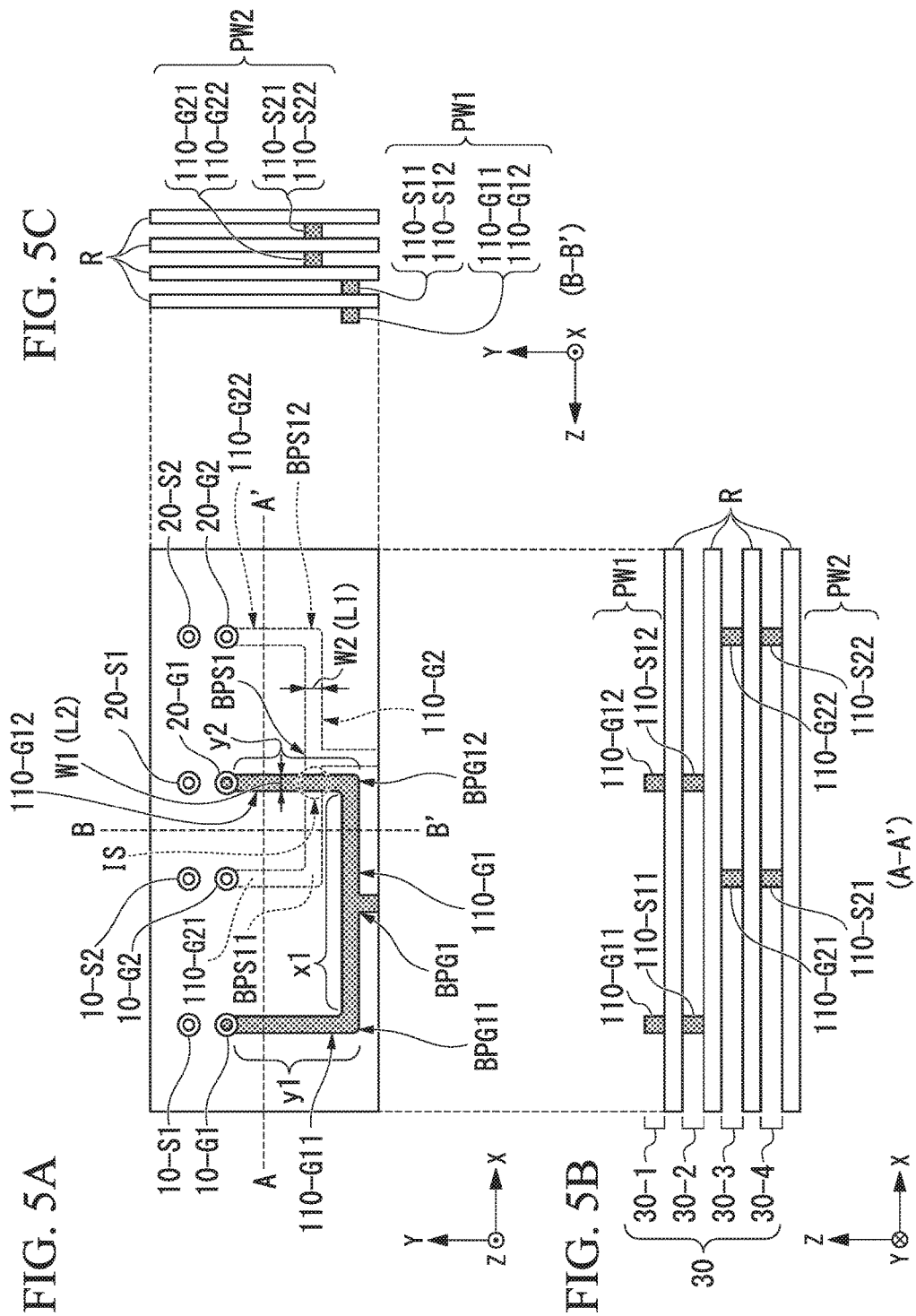

POWER CONVERTER

BACKGROUND OF THE INVENTION

Field of the Invention

An embodiment of the present invention relates to a power converter.

Priority is claimed on Japanese Patent Application No. 2016-171287, filed Sep. 1, 2016, the content of which is incorporated herein by reference.

Description of Related Art

In the related art, a technique for saving labor in wiring work using a printed wiring board for a wiring that connects a drive circuit of a semiconductor switch and a semiconductor switch in a power converter including a DC to AC conversion circuit or an AC to DC conversion circuit is known (for example, refer to Japanese Unexamined Patent Application First Publication No. 2010-252490).

When the printed wiring board is used for the wiring that connects a drive circuit of a semiconductor switch and a semiconductor switch, the semiconductor switch may malfunction due to noise caused in a wiring pattern of the printed wiring board such as inductive noise or noise caused by charge and discharge of a parasitic capacitance. However, in the related art described above, the wiring pattern of the printed wiring board for reducing such noise is not disclosed. That is, in the related art described above, there is a problem in that it is not possible to reduce malfunctions of the semiconductor switch due to noise caused in the wiring pattern of the printed wiring board.

SUMMARY OF THE INVENTION

The present invention provides a power converter capable of reducing malfunctions of a semiconductor switch due to noise caused in a wiring pattern of a printed wiring board.

An embodiment of the present invention is a power converter in which a plurality of semiconductor switches are connected to a plurality of drive circuits configured to control states of the semiconductor switches, the power converter including: a first semiconductor switch; a second semiconductor switch whose reference potential is different from a reference potential of the first semiconductor switch; a first drive circuit configured to control a state of the first semiconductor switch; a second drive circuit configured to control a state of the second semiconductor switch; and a multilayer substrate in which a first wiring that connects the first drive circuit and the first semiconductor switch and includes a reference potential wiring and a control signal wiring and a second wiring that connects the second drive circuit and the second semiconductor switch and includes a reference potential wiring and a control signal wiring are disposed, wherein, in the multilayer substrate, the reference potential wiring and the control signal wiring of the first wiring are disposed in different layers at positions overlapping in a substrate lamination direction, the reference potential wiring and the control signal wiring of the second wiring are disposed in different layers at positions overlapping in the lamination direction, and a wiring length of a portion in which the first wiring and the second wiring overlap in the lamination direction is set to be shorter than either a wiring length of a portion in which the reference potential wiring and the control signal wiring of the first wiring overlap in the lamination direction or a wiring length of a portion in which the reference potential wiring and the control signal wiring of the second wiring overlap in the lamination direction.

In addition, the power converter of the embodiment of the present invention further includes a third semiconductor switch whose reference potential is the same as the reference potential of the first semiconductor switch, wherein the first drive circuit additionally controls a state of the third semiconductor switch, and wherein, in the multilayer substrate, a reference potential wiring that connects the first drive circuit and the third semiconductor switch and the reference potential wiring of the first wiring are disposed in the same layer, and a control signal wiring that connects the first drive circuit and the third semiconductor switch and the control signal wiring of the first wiring are disposed in the same layer.

In addition, the power converter of the embodiment of the present invention further includes a fourth semiconductor switch whose reference potential is the same as the reference potential of the second semiconductor switch, wherein the second drive circuit additionally controls a state of the fourth semiconductor switch, and wherein, in the multilayer substrate, a reference potential wiring that connects the second drive circuit and the fourth semiconductor switch and the reference potential wiring of the second wiring are disposed in the same layer, a control signal wiring that connects the second drive circuit and the fourth semiconductor switch and the control signal wiring of the second wiring are disposed in the same layer, and the semiconductor switches are disposed in the order of the first semiconductor switch, the second semiconductor switch, the third semiconductor switch, and the fourth semiconductor switch.

In addition, in the power converter of the embodiment of the present invention, a wiring shape of the reference potential wiring and a wiring shape of the control signal wiring of a portion in which the reference potential wiring and the control signal wiring overlap in the lamination direction match when viewed in the substrate lamination direction.

In addition, in the power converter of the embodiment of the present invention, in a portion in which the first wiring and the second wiring overlap in the lamination direction, a wiring length of one wiring between the first wiring and the second wiring is the same as a wiring width of the other wiring.

According to the above-described power converter, it is possible to provide a power converter capable of reducing malfunctions of a semiconductor switch due to noise caused in a wiring pattern of a printed wiring board.

BRIEF DESCRIPTION OF THE DRAWINGS

FIG. 5A is a diagram showing an example of wiring patterns of layers of a multilayer printed wiring board of the present embodiment viewed in an x-axis direction which shows one layer of the board;

FIG. 5B is a view of the multilayer board, along a y-axis direction.

FIG. 5C is a view of the multilayer board, along a z-axis direction.

DETAILED DESCRIPTION OF THE INVENTION

Embodiment

A form of a power converter according to the present embodiment will be described below with reference to the drawings.

Figure 1:
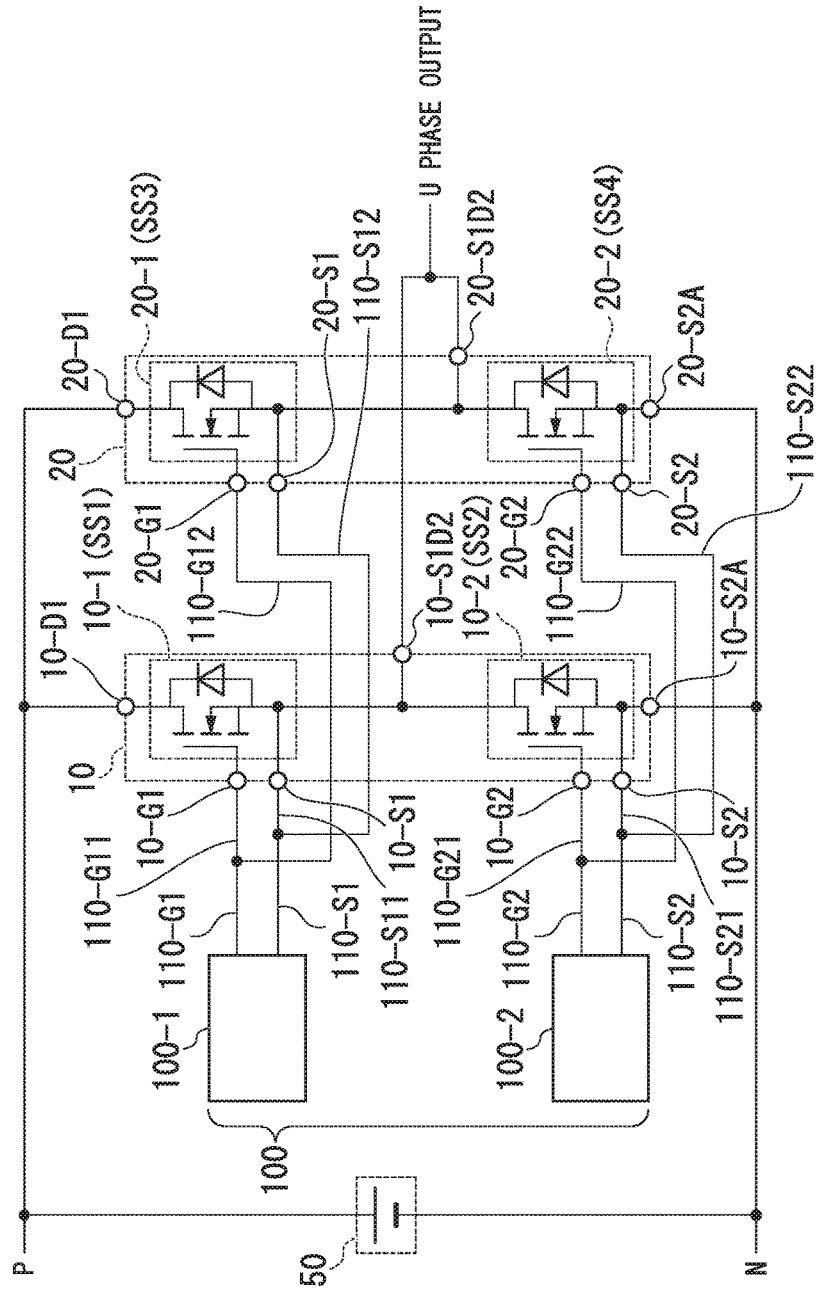
FIG. 1 is a diagram showing an example of a circuit configuration of a power converter of the present embodiment.

FIG. 1 is a diagram showing an example of a circuit configuration of a power converter 1 of the present embodiment. The power converter 1 of the present embodiment includes a so-called 2-level inverter circuit. FIG. 1 shows a circuit configuration of a single phase (for example, a U phase) in a multi-phase 2-level inverter circuit included in the power converter 1. The power converter 1 includes a first module 10, a second module 20, a drive circuit 100, and a DC power supply 50.

The first module 10 and the second module 20 each include two semiconductor switches SS.

Specifically, the first module 10 includes an upper arm semiconductor switch 10-1 and a lower arm semiconductor switch 10-2. The second module 20 includes an upper arm semiconductor switch 20-1 and a lower arm semiconductor switch 20-2. These semiconductor switches SS each include an MOSFET and a diode.

In the following description, the upper arm semiconductor switch 10-1 and the upper arm semiconductor switch 20-1 will be referred to simply as an upper arm, and the lower arm semiconductor switch 10-2 and the lower arm semiconductor switch 20-2 will be referred to simply as a lower arm.

In addition, the upper arm semiconductor switch 10-1 will be referred to as a first semiconductor switch SS1, and the lower arm semiconductor switch 10-2 will be referred to as a second semiconductor switch SS2. The upper arm semiconductor switch 20-1 will be referred to as a third semiconductor switch SS3 and the lower arm semiconductor switch 20-2 will be referred to as a fourth semiconductor switch SS4.

The first module 10 and the second module 20 are connected in parallel to a positive potential P and a negative potential N of the DC power supply 50. A connection point of the upper arm and the lower arm of the first module 10 and a connection point of the upper arm and the lower arm of the second module 20 are connected to an AC output (a U phase output).

The drive circuit 100 applies a control signal (a gate signal) to the semiconductor switch SS. The drive circuit 100 includes a first drive circuit 100-1 configured to apply a control signal to the upper arm and a second drive circuit 100-2 configured to apply a control signal to the lower arm.

The first drive circuit 100-1 is connected to the upper arm semiconductor switch 10-1 and the upper arm semiconductor switch 20-1 by a control signal wiring and a reference potential wiring. The first drive circuit 100-1 controls a state of the first semiconductor switch SS1 and a state of the third semiconductor switch SS3.

The second drive circuit 100-2 is connected to the lower arm semiconductor switch 10-2 and the lower arm semiconductor switch 20-2 by a control signal wiring and a reference potential wiring. The second drive circuit 100-2 controls a state of the second semiconductor switch SS2 and a state of the fourth semiconductor switch SS4.

The control signal wiring and the reference potential wiring include a common wiring portion from the drive circuit 100 to a branch point of the wiring and a branch wiring portion from the branch point to each of the semiconductor switches SS.

Specifically, the control signal wiring that connects the first drive circuit 100-1 and the upper arm includes a control signal common wiring 110-G1, a control signal first branch wiring 110-G11, and a control signal second branch wiring 110-G12. The control signal common wiring 110-G1 is a common wiring portion from the first drive circuit 100-1 to a branch point of the wiring. The control signal first branch wiring 110-G11 is a branch wiring portion from the branch point to the upper arm semiconductor switch 10-1. The control signal second branch wiring 110-G12 is a branch wiring portion from the branch point to the upper arm semiconductor switch 20-1.

In addition, the reference potential wiring that connects the first drive circuit 100-1 and the upper arm includes a reference potential common wiring 110-S1, a reference potential first branch wiring 110-S11, and a reference potential second branch wiring 110-S12. The reference potential common wiring 110-S1 is a common wiring portion from the first drive circuit 100-1 to a branch point of the wiring. The reference potential first branch wiring 110-S11 is a branch wiring portion from the branch point to the upper arm semiconductor switch 10-1. The reference potential second branch wiring 110-S12 is a branch wiring portion from the branch point to the upper arm semiconductor switch 20-1.

In addition, the control signal wiring that connects the second drive circuit 100-2 and the lower arm includes a control signal common wiring 110-G2, a control signal first branch wiring 110-G21, and a control signal second branch wiring 110-G22. The control signal common wiring 110-G2 is a common wiring portion from the second drive circuit 100-2 to a branch point of the wiring. The control signal first branch wiring 110-G21 is a branch wiring portion from the branch point to the lower arm semiconductor switch 10-2. The control signal second branch wiring 110-G22 is a branch wiring portion from the branch point to the lower arm semiconductor switch 20-2.

In addition, the reference potential wiring that connects the second drive circuit 100-2 and the lower arm includes a reference potential common wiring 110-S2, a reference potential first branch wiring 110-S21, and a reference potential second branch wiring 110-S22. The reference potential common wiring 110-S2 is a common wiring portion from the second drive circuit 100-2 to a branch point of the wiring. The reference potential first branch wiring 110-S21 is a branch wiring portion from the branch point to the lower arm semiconductor switch 10-2. The reference potential second branch wiring 110-S22 is a branch wiring portion from the branch point to the lower arm semiconductor switch 20-2.

In the following description, a wiring that connects the first drive circuit 100-1 and the first semiconductor switch SS I will be referred to as a first wiring PW1. The first wiring PW1 includes the reference potential common wiring 110-S1 and the control signal common wiring 110-G1. In addition, a wiring that connects the second drive circuit 100-2 to the second semiconductor switch SS2 will be referred to as a second wiring PW2. The second wiring PW2 includes the reference potential common wiring 110-S2 and the control signal common wiring 110-G2.

According to the above-described configuration, the power converter 1 applies a control signal (a gate signal) to the plurality of semiconductor switches SS connected in parallel from the drive circuit 100 and operates the plurality of semiconductor switches SS in parallel.

Next, a circuit connection of the first module 10 will be described with reference to FIG. 2. Since a circuit connection of the second module 20 matches a circuit connection of the first module 10, description thereof will be omitted.

Figure 2:
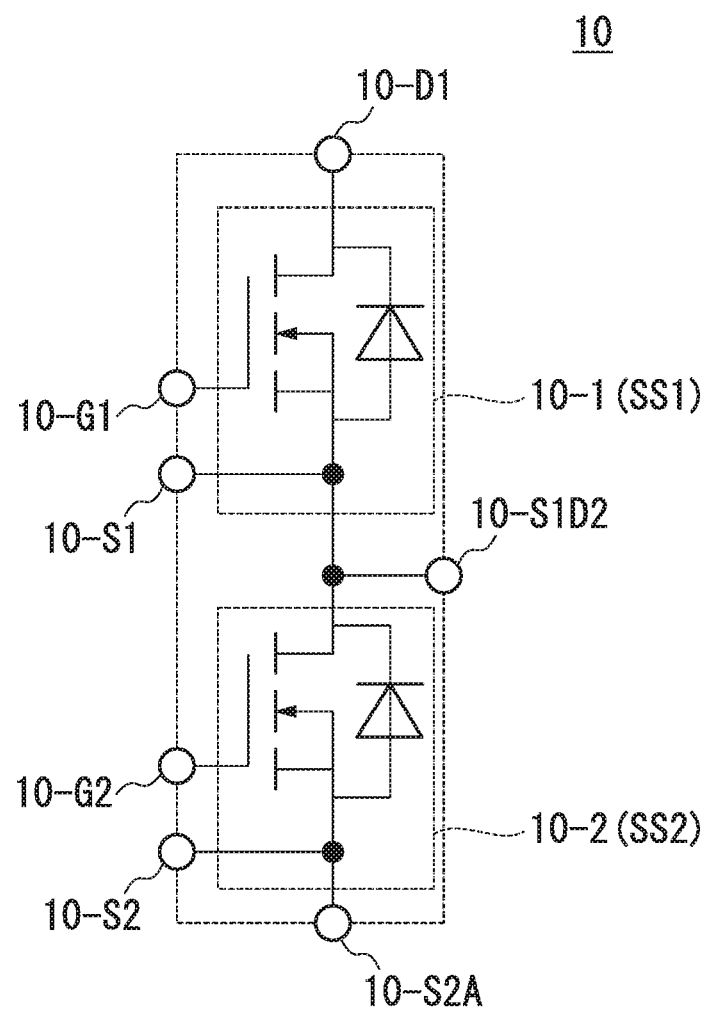
FIG. 2 is a diagram showing an example of a circuit connection of a semiconductor switch module of the present embodiment.

FIG. 2 is a diagram showing an example of a circuit connection of a semiconductor switch module of the present embodiment.

The first module 10 includes a high potential connection terminal 10-D1, a low potential connection terminal 10-S2A, a first AC output terminal 10-S1D2, a first gate connection terminal 10-G1, a second gate connection terminal 10-G2, a first auxiliary source connection terminal 10-S1, and a second auxiliary source connection terminal 10-S2.

The high potential connection terminal 10-D1 is connected to the positive potential P of the DC power supply 50. The low potential connection terminal 10-S2A is connected to the negative potential N of the DC power supply 50. The first AC output terminal 10-S1D2 is connected to a second AC output terminal 20-S1D2 of the second module 20 and outputs an alternating current.

A control signal (a gate signal) is supplied to the first gate connection terminal 10-G1 from the first drive circuit 100-1 through the control signal common wiring 110-G1. A reference potential is supplied to the first auxiliary source connection terminal 10-S1 from the first drive circuit 100-1 through the reference potential common wiring 110-S1.

A control signal (a gate signal) is supplied to the second gate connection terminal 10-G2 from the second drive circuit 100-2 through the control signal common wiring 110-G2. A reference potential is supplied to the second auxiliary source connection terminal 10-S2 from the second drive circuit 100-2 through the reference potential common wiring 110-S2.

As described above, a reference potential is supplied to the first auxiliary source connection terminal 10-S1 of the first module 10 from the first drive circuit 100-1. A reference potential is supplied from the second drive circuit 100-2 to the second auxiliary source connection terminal 10-S2 of the first module 10. The reference potential supplied to the first auxiliary source connection terminal 10-S1 and the reference potential supplied to the second auxiliary source connection terminal 10-S2 are different.

In the second module 20 connected in parallel to the first module 10, similarly to the first module 10, a reference potential is supplied to a first auxiliary source connection terminal 20-S1 from the first drive circuit 100-1. In addition, a reference potential is supplied to a second auxiliary source connection terminal 20-S2 of the second module 20 from the second drive circuit 100-2. The reference potential supplied to the first auxiliary source connection terminal 20-S1 and the reference potential supplied to the second auxiliary source connection terminal 20-S2 are different.

That is, the upper arm semiconductor switch SS and the lower arm semiconductor switch SS have different reference potentials.

In other words, the reference potential of the second semiconductor switch SS2 and the reference potential of the first semiconductor switch SS1 are different. That is, the power converter 1 includes the second semiconductor switch SS2 whose reference potential is different from the reference potential of the first semiconductor switch SS1.

In addition, the reference potential of the third semiconductor switch SS3 is the same as the reference potential of the first semiconductor switch SS1. That is, the power converter 1 includes the third semiconductor switch SS3 whose reference potential is the same as the reference potential of the first semiconductor switch SS1.

In addition, the reference potential of the fourth semiconductor switch SS4 is the same as the reference potential of the second semiconductor switch SS2. That is, the power converter 1 includes the fourth semiconductor switch SS4 whose reference potential is the same as the reference potential of the second semiconductor switch SS2.

Figure 3:
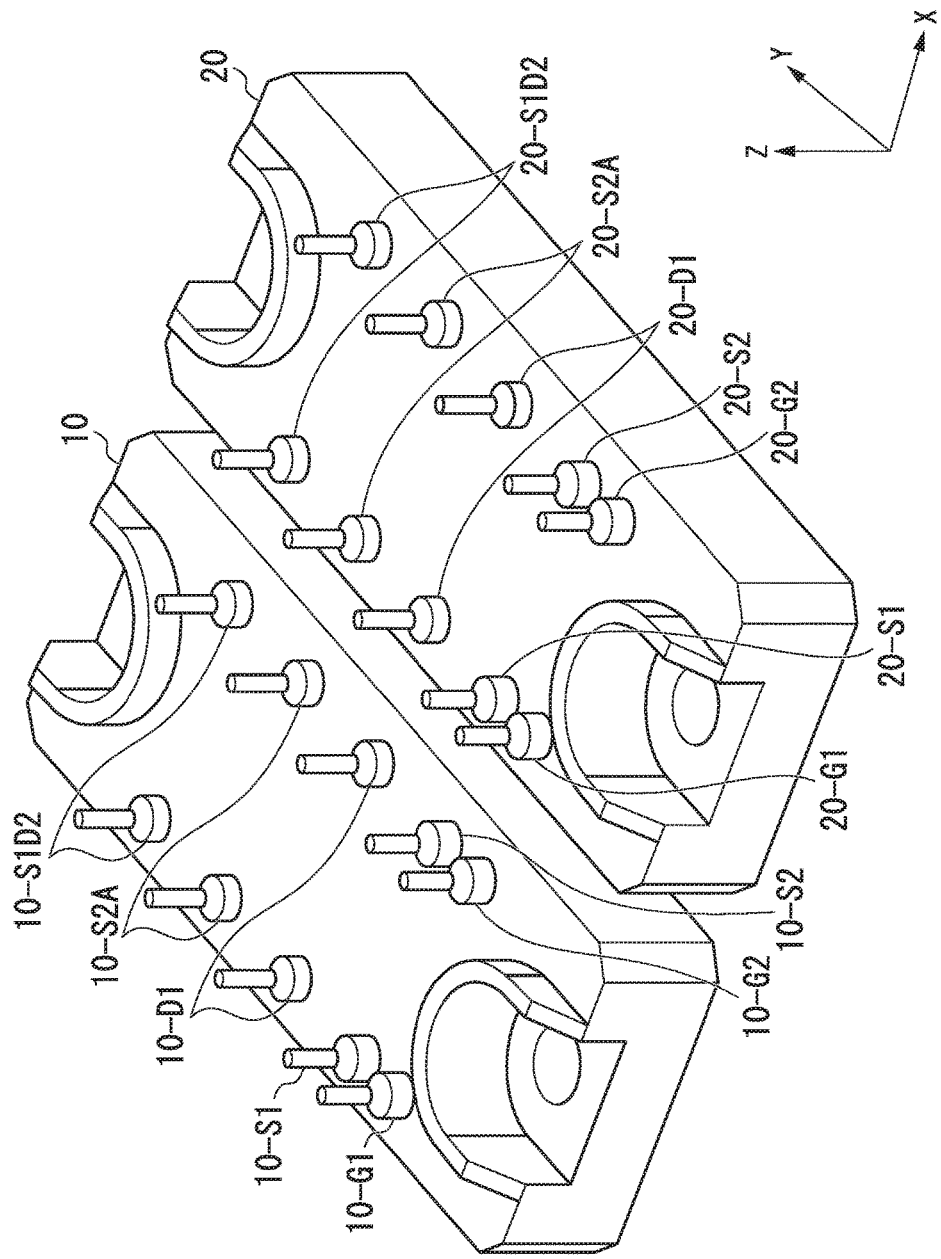
FIG. 3 is a diagram showing an example of an appearance of the semiconductor switch module of the present embodiment.

FIG. 3 is a diagram showing an example of an appearance of a semiconductor switch module of the present embodiment. Hereinafter, an XYZ orthogonal coordinate system will be used to indicate a direction and a position as necessary. In the XYZ orthogonal coordinate system, an XY plane indicates a plane on which a semiconductor switch module is placed.

Z axis indicates a direction from the bottom to the top of the semiconductor switch module. In the semiconductor switch module, terminals protrude from the top in the Z axis direction. A Y axis indicates a direction in which terminals of one semiconductor switch SS among the plurality of semiconductor switches SS included in the semiconductor switch module are arranged. An X axis indicates a direction in which a plurality of semiconductor switch modules are sequentially arranged.

The first module 10 and the second module 20 are sequentially disposed in the X axis direction. The first semiconductor switch SS1 and the second semiconductor switch SS2 of the first module 10 and the third semiconductor switch SS3 and the fourth semiconductor switch SS4 of the second module 20 are sequentially disposed in the X axis direction in that order. That is, the semiconductor switches SS are disposed in the order of the first semiconductor switch SS1, the second semiconductor switch SS2, the third semiconductor switch SS3, and the fourth semiconductor switch SS4.

As shown in FIG. 3, the first module 10 and the second module 20 connected in parallel are disposed adjacent to each other. In addition, the same semiconductor switch module is used for the first module 10 and the second module 20. Therefore, a terminal arrangement of the first module 10 and a terminal arrangement of the second module 20 match.

All of the terminals of the first module 10, that is, the high potential connection terminal 10-D1, the low potential connection terminal 10-S2A, the first AC output terminal 10-S1D2, the first gate connection terminal 10-G1, the second gate connection terminal 10-G2, the first auxiliary source connection terminal 10-S1, and the second auxiliary source connection terminal 10-S2, are formed as pin terminals that protrude from the top of the semiconductor switch module.

Among the terminals, the high potential connection terminal 10-D1, the low potential connection terminal 10-S2A, and the first AC output terminal 10-S1D2 are formed as a pair of pin terminals.

Next, for the semiconductor switch module, a structure of the power converter 1 in which a multilayer printed wiring board 30 and the drive circuit 100 are combined will be described with reference to FIG. 4.

Figure 4:
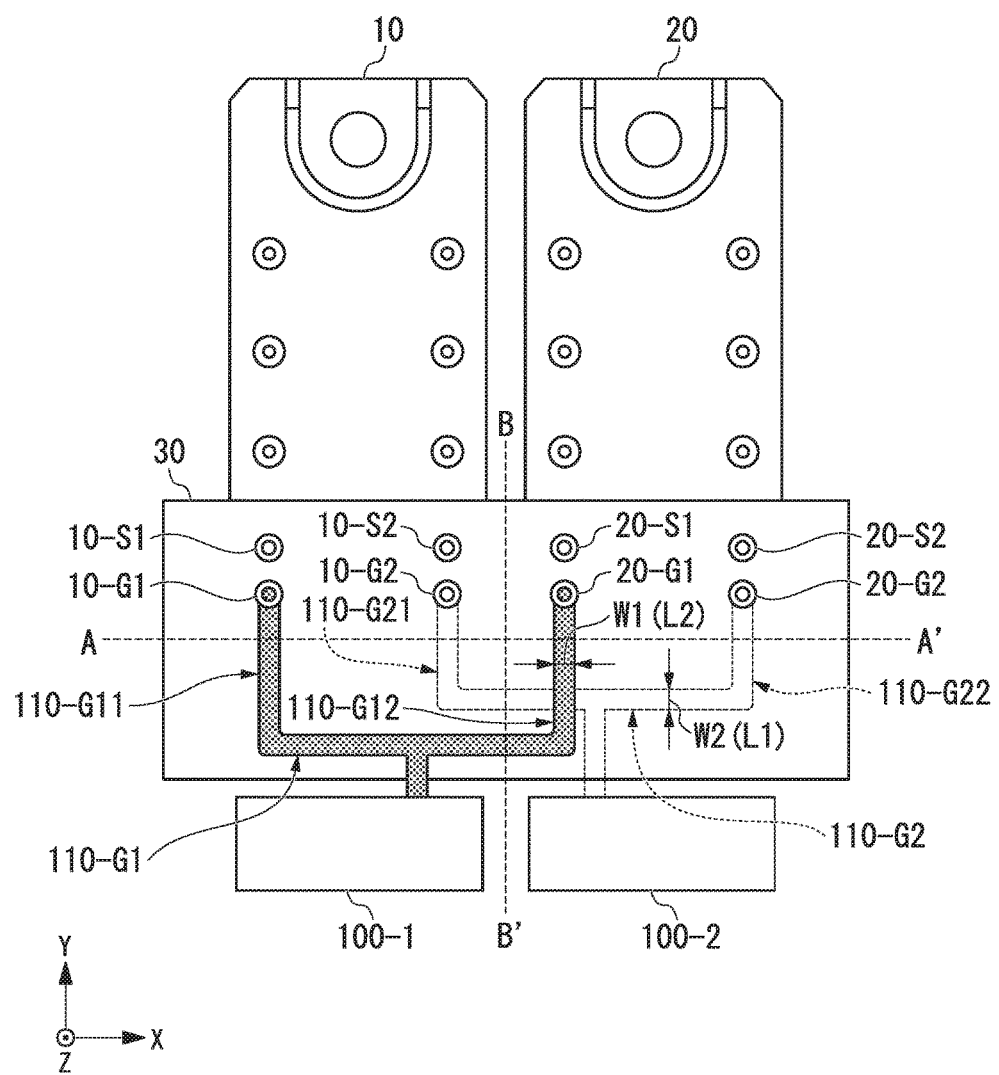
FIG. 4 is a diagram showing an example of a configuration of the power converter of the present embodiment, viewed in a Z axis direction.

FIG. 4 is a diagram showing an example of a configuration of the power converter 1 of the present embodiment when viewed in the Z axis direction.

In the power converter 1, the drive circuit 100 is connected to the first module 10 and the second module 20 through the multilayer printed wiring board 30. In the following description, the multilayer printed wiring board 30 will be referred to simply as a multilayer substrate.

As indicated by solid lines in FIG. 4, in the multilayer printed wiring board 30, a wiring pattern that connects the first drive circuit 100-1 to the first gate connection terminal 10-G1 and the first auxiliary source connection terminal 10-S1 of the first module 10, and a first gate connection terminal 20-G1 and the first auxiliary source connection terminal 20-S1 of the second module 20 is formed. In addition, as indicated by dashed lines in FIG. 4, in the multilayer printed wiring board 30, a wiring pattern that connects the second drive circuit 100-2, the second gate connection terminal 10-G2 and the second auxiliary source connection terminal 10-S2 of the first module 10, and a second gate connection terminal 20-G2 and the second auxiliary source connection terminal 20-S2 of the second module 20 is formed.

In addition, the multilayer printed wiring board 30 has through holes into and on which terminals of the first module 10 and the second module 20 are inserted and mounted. When the multilayer printed wiring board 30 has the through holes, it is possible to reduce a wiring length between the drive circuit 100 and the semiconductor switch SS more than when terminals are connected by, for example, an electrical wire.

The Z axis direction is a lamination direction of layers of the multilayer printed wiring board 30. Disposition of a wiring pattern and a shape of a wiring pattern of layers of the multilayer printed wiring board 30 will be described with reference to FIGS. 5A, 5B, 5C, 6A, 6B, 7A and 7B.

FIGS. 5A, 5B and 5C are diagrams showing an example of wiring patterns of layers of the multilayer printed wiring board 30 of the present embodiment. In this example, the multilayer printed wiring board 30 includes a 4-layer wiring pattern. A specific example of such a 4-layer wiring pattern is shown in FIGS. 6A and 6B and FIGS. 7A and 7B.

Figure 6A:
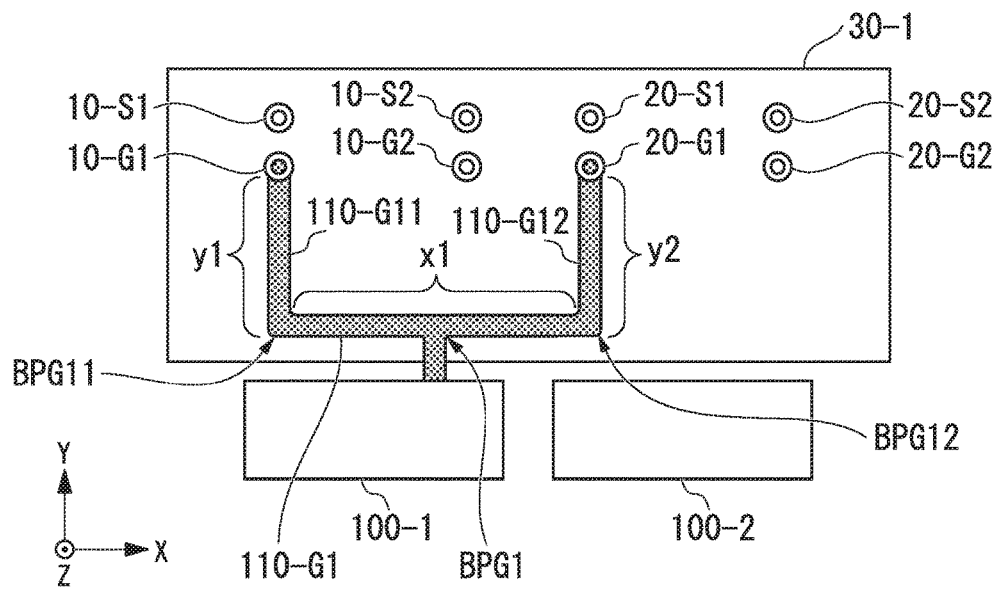
FIG. 6A is a diagram showing an example of wiring patterns of a first layer "in an x-axis direction" of the multilayer printed wiring board of the present embodiment.
Figure 6B:
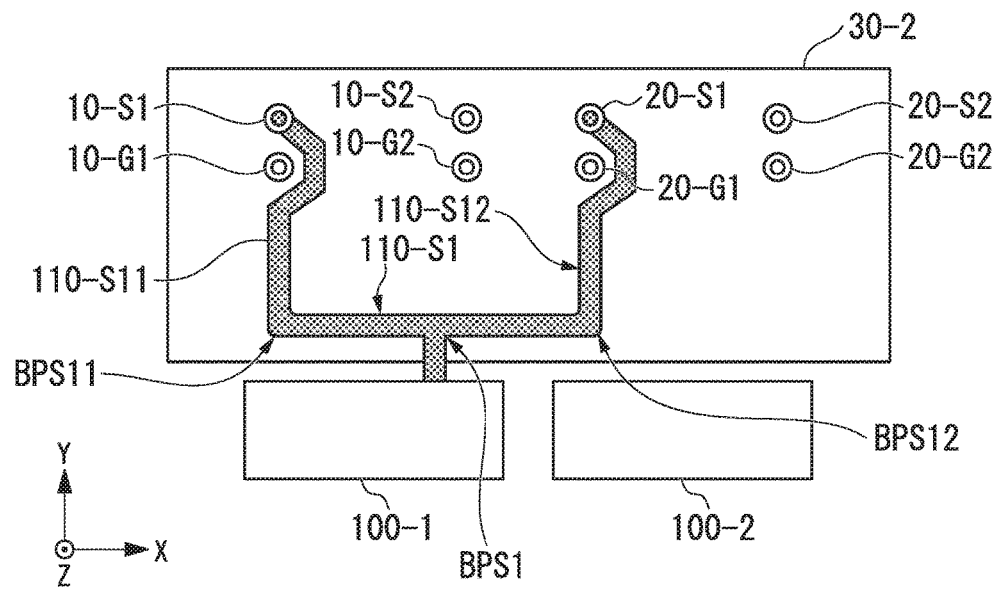
FIG. 6B is a diagram showing an example of wiring patterns of a second layer "in an x-axis direction of the multilayer printed wiring board of the present embodiment.

FIG. 6A is a diagram showing an example of a wiring pattern of a first layer 30-1 of the multilayer printed wiring board 30 of the present embodiment in FIGS. 5A, 5B and 5C; and FIG. 6B is a diagram showing an example of a wiring pattern of a second layer 30-2 of the multilayer printed wiring board 30 of the present embodiment in FIGS. 5A, 5B and 5C.

Figure 7A:
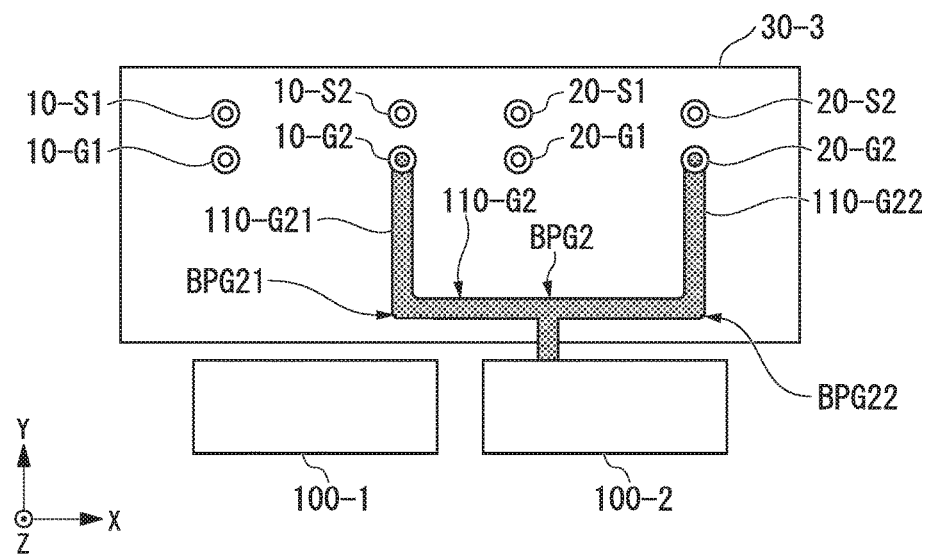
FIG. 7A is a diagram showing an example of wiring patterns of a third layer of the multilayer printed wiring board of the present embodiment.
Figure 7B:
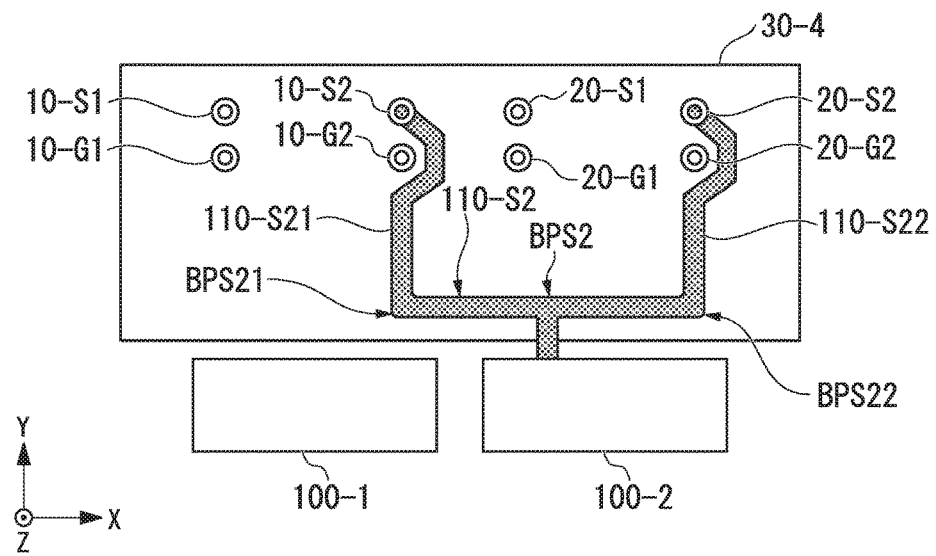
FIG. 7B is a diagram showing an example of wiring patterns of a fourth layer of the multilayer printed wiring board of the present embodiment.

FIG. 7A is a diagram showing an example of a wiring pattern of a third layer 30-3 of the multilayer printed wiring board 30 of the present embodiment in FIGS. 5A, 5B and 5C; and FIG. 7B is a diagram showing an example of a wiring pattern of a fourth layer 30-4 of the multilayer printed wiring board 30 of the present embodiment in FIGS. 5A, 5B and 5C.

[Wiring Pattern of First Layer]

As shown in FIG. 6A, a wiring pattern of a control signal wiring that connects the first drive circuit 100-1 to the first gate connection terminal 10-G1 of the first module 10, and the first gate connection terminal 20-G1 of the second module 20 is formed in the first layer 30-1. Specifically, a wiring pattern of the control signal common wiring 110-G1, the control signal first branch wiring 110-G11, and the control signal second branch wiring 110-G12 is formed in the first layer 30-1. The control signal common wiring 110-G1 is formed as a wiring pattern from the first drive circuit 100-1 in the first layer 30-1 to a branch point BPG11 and a branch point BPG12 through a branch point BPG1. The control signal first branch wiring 110-G11 is formed as a wiring pattern from the branch point BPG11 to the first gate connection terminal 10-G1. The control signal second branch wiring 110-G12 is formed as a wiring pattern from the branch point BPG12 to the first gate connection terminal 20-G1.

[Wiring Pattern of Second Layer]

As shown in FIG. 6B, a wiring pattern of the reference potential wiring that connects the first drive circuit 100-1 to the first auxiliary source connection terminal 10-S1 of the first module 10 and the first auxiliary source connection terminal 20-S1 of the second module 20 is formed in the second layer 30-2. Specifically, a wiring pattern of the reference potential common wiring 110-S1, the reference potential first branch wiring 110-S11, and the reference potential second branch wiring 110-S12 is formed in the second layer 30-2. The reference potential common wiring 110-S1 is formed as a wiring pattern from the first drive circuit 100-1 in the second layer 30-2 to a branch point BPS11 and a branch point BPS12 through a branch point BPS1. The reference potential first branch wiring 110-S11 is formed as a wiring pattern from the branch point BPS11 to the first auxiliary source connection terminal 10-S1. The reference potential second branch wiring 110-S12 is formed as a wiring pattern from the branch point BPS12 to the first auxiliary source connection terminal 20-S1.

[Wiring Pattern of Third Layer]

As shown in FIG. 7A, a wiring pattern of the control signal wiring that connects the second drive circuit 100-2 to the second gate connection terminal 10-G2 of the first module 10 and the second gate connection terminal 20-G2 of the second module 20 is formed in the third layer 30-3. Specifically, wiring patterns of the control signal common wiring 110-G2, the control signal first branch wiring 110-G21, and the control signal second branch wiring 110-G22 are formed in the third layer 30-3. The control signal common wiring 110-G2 is formed as a wiring pattern from the second drive circuit 100-2 in the third layer 30-3 to a branch point BPG21 and a branch point BPG22 through a branch point BPG2. The control signal first branch wiring 110-G21 is formed as a wiring pattern from the branch point BPG21 to the second gate connection terminal 10-G2. The control signal second branch wiring 110-G22 is formed as a wiring pattern from the branch point BPG22 to the second gate connection terminal 20-G2.

[Wiring Pattern of Fourth Layer]

As shown in FIG. 7B, a wiring pattern of the reference potential wiring that connects the second drive circuit 100-2 to the second auxiliary source connection terminal 10-S2 of the first module 10 and the second auxiliary source connection terminal 20-S2 of the second module 20 is formed in the fourth layer 30-4. Specifically, wiring patterns of the reference potential common wiring 110-S2, the reference potential first branch wiring 110-S21, and the reference potential second branch wiring 110-S22 are formed in the fourth layer 30-4. The reference potential common wiring 110-S2 is formed as a wiring pattern from the second drive circuit 100-2 in the fourth layer 30-4 to a branch point BPS21 and a branch point BPS22 through a branch point BPS2. The reference potential first branch wiring 110-S21 is formed as a wiring pattern from the branch point BPS21 to the second auxiliary source connection terminal 10-S2. The reference potential second branch wiring 110-S22 is formed as a wiring pattern from the branch point BPS22 to the second auxiliary source connection terminal 20-S2.

[Common Wiring and Branch Wiring]

In the example shown in FIG. 5A, within the wiring pattern of the control signal common wiring 110-G1, a wiring pattern from the branch point BPG11 to the branch point BPG12 will be referred to simply as a common wiring.

That is, the common wiring is a wiring pattern which extends in a direction in which the semiconductor switch modules are arranged, that is, in the X axis direction in FIG. 5A, within the wiring pattern from the drive circuit to the semiconductor switch module.

In addition, in this example, a wiring pattern of the control signal first branch wiring 110-G11 and a wiring pattern of the control signal second branch wiring 110-G12 will be referred to simply as a branch wiring. That is, the branch wiring is a wiring pattern which extends in a direction from the common wiring to the semiconductor switch module, that is, in the Y axis direction, within the wiring pattern from the drive circuit to the semiconductor switch module.

The above-described branch point BP is a position at which one wiring pattern is divided into a plurality of wiring patterns among positions on the wiring pattern or a position at which division occurs from the wiring pattern of the common wiring among positions on the wiring pattern. For example, the branch point BPG1 shown in FIG. 5A is an example of a position at which one wiring pattern is divided into a plurality of wiring patterns among positions on the wiring pattern of the control signal wiring. In addition, the branch point BPG11 and the branch point BPG12 shown in FIG. 5A are examples of positions at which a wiring pattern is divided from the wiring pattern of the common wiring among positions on the wiring pattern of the control signal wiring.

That is, the wiring pattern formed on the multilayer printed wiring board 30 includes the common wiring and the branch wiring. The common wiring is a wiring pattern from the drive circuit 100 to the branch point BP. The branch wiring is a wiring pattern branched from the common wiring at the branch point BP and is a wiring pattern from the branch point BP to terminals of the semiconductor switch SS.

[Wiring Length of Wiring Pattern]

In the example shown in FIG. 5A, within the wiring pattern of the control signal common wiring 110-G1, a wiring length L of a wiring pattern from the branch point BPG11 to the branch point BPG12, that is, a wiring length L of the common wiring, is a length x1.

In addition, in this example, the wiring length L of the wiring pattern of the control signal first branch wiring 110-G11 is a length y1. The wiring length L of the wiring pattern of the control signal second branch wiring 110-G12 is a length y2. In this example, the length y1 and the length y2 are the same.

In addition, in this example, within the wiring pattern of the common wiring, the wiring length L from the branch point BPG1 to the branch point BPG11 and the wiring length L from the branch point BPG1 to the branch point BPG12 are the same. That is, the branch point BPG1 is the midpoint of the wiring pattern of the common wiring.

In addition, the wiring length L of the wiring pattern of the control signal first branch wiring 110-G11 and the wiring length L of the wiring pattern of the control signal second branch wiring 110-G12 are the same. That is, the wiring lengths L of the wiring patterns of the branch wirings are the same.

In this example, in wiring patterns from the drive circuit 100 to the plurality of semiconductor switch modules, the wiring lengths L are the same. That is, the wiring patterns from the drive circuit 100 to the plurality of semiconductor switch modules are wirings with the same length. In addition, the wiring patterns from the drive circuit 100 to the plurality of semiconductor switch modules have a structure that is symmetrical with respect to the branch point BPG1, that is, the midpoint of the wiring pattern of the common wiring.

While the wiring pattern of the first layer 30-1 has been described as an example, the wiring length L of the wiring pattern of the other layer of the multilayer printed wiring board 30 is the same as that of the wiring pattern of the first layer. That is, in the layers of the multilayer printed wiring board 30, the wiring patterns from the drive circuit 100 to the plurality of semiconductor switch modules are wirings with the same length. In addition, in the layers of the multilayer printed wiring board 30, the wiring patterns from the drive circuit 100 to the plurality of semiconductor switch modules have a structure that is symmetrical with respect to the midpoint of the wiring pattern of the common wiring.

[Disposition of Wiring Pattern in Lamination Direction]

As shown in FIGS. 5A, 5B and 5C, a wiring pattern of the first layer 30-1 in FIG. 6A and a wiring pattern of the second layer 30-2 in FIG. 6B are disposed at positions overlapping in a lamination direction AZ of the multilayer printed wiring board 30. In addition, a wiring pattern of the third layer 30-3 in FIG. 7A and a wiring pattern of the fourth layer 30-4 in FIG. 7B are disposed at positions overlapping in the lamination direction AZ of the multilayer printed wiring board 30.

The lamination direction AZ of the multilayer printed wiring board 30 is a direction in which the layers of the multilayer printed wiring board 30 are laminated, that is, the Z axis direction in FIG. 5.

Specifically, a wiring pattern of the control signal wiring of the first layer 30-1 in FIGS. 6A and 6B and a wiring pattern of the reference potential wiring of the second layer 30-2 in FIG. 6B are disposed at positions overlapping in the lamination direction AZ.

More specifically, the wiring pattern of the control signal common wiring 110-G1 of the first layer 30-1 and the wiring pattern of the reference potential common wiring 110-S1 of the second layer 30-2 are disposed at positions overlapping in the lamination direction AZ. The wiring pattern of the control signal first branch wiring 110-G11 of the first layer 30-1 and the wiring pattern of the reference potential first branch wiring 110-S11 of the second layer 30-2 are disposed at positions overlapping in the lamination direction AZ. The wiring pattern of the control signal second branch wiring 110-G12 of the first layer 30-1 and the wiring pattern of the reference potential second branch wiring 110-S12 of the second layer 30-2 are disposed at positions overlapping in the lamination direction AZ.

That is, the multilayer printed wiring board 30 has a so-called laminate structure in which a control signal wiring and a reference potential wiring of one semiconductor switch SS are disposed with an insulating layer R interposed therebetween.

Specifically, as shown in FIG. 5B and FIG. 5C, the multilayer printed wiring board 30 has a laminate structure in which the control signal first branch wiring 110-G11 and the reference potential first branch wiring 110-S11 are disposed with the insulating layer R interposed therebetween for the first semiconductor switch SS1. In addition, the multilayer printed wiring board 30 has a laminate structure in which the control signal first branch wiring 110-G21 and the reference potential first branch wiring 110-S21 are disposed with the insulating layer R interposed therebetween for the second semiconductor switch SS2. Similarly to the third semiconductor switch SS3 and the fourth semiconductor switch SS4, the multilayer printed wiring board 30 has a laminate structure.

As the thickness of the insulating layer R in the Z axis direction, a thickness at which it is possible to ensure isolation of a current that flows in the wiring patterns is selected.

In the control signal wiring, the gate drive current flows in the direction from the drive circuit 100 toward the semiconductor switch SS. In addition, in the reference potential wiring, a current having the same current value as the above-described gate drive current flows in the direction from the semiconductor switch SS toward the drive circuit 100. That is, in the control signal wiring and the reference potential wiring, currents having the same current value in opposite direction, that is, reciprocating currents, flow. Therefore, when the multilayer printed wiring board 30 has a laminate structure, a magnetic flux generated by a current that flows in one wiring and a magnetic flux generated by a current that flows in the other wiring are cancelled out. Therefore, when the multilayer printed wiring board 30 has a laminate structure, it is possible to reduce a wiring inductance of the control signal wiring and the reference potential wiring.

In other words, a reference potential wiring and a control signal wiring of the first wiring PW1 are disposed in different layers at positions overlapping in the lamination direction AZ of the multilayer printed wiring board 30. In this example, the first wiring PW1 is a reference potential wiring and a control signal wiring that connect the first drive circuit 100-1 to the first semiconductor switch SS1 and the third semiconductor switch SS3.

In addition, a reference potential wiring and a control signal wiring of the second wiring PW2 are disposed in different layers at positions overlapping in the lamination direction AZ of the multilayer printed wiring board 30. In this example, the second wiring PW2 is a reference potential wiring and a control signal wiring that connect the second drive circuit 100-2 to the second semiconductor switch SS2 and the fourth semiconductor switch SS4.

In addition, in other words, in the multilayer printed wiring board 30, the reference potential second branch wiring 110-S12 that connects the first drive circuit 100-1 and the third semiconductor switch SS3 and the reference potential first branch wiring 110-S11 of the first wiring PW1 are disposed in the same layer.

In the multilayer printed wiring board 30, the control signal second branch wiring 110-G12 that connects the first drive circuit 100-1 and the third semiconductor switch SS3 and the control signal first branch wiring 110-G11 of the first wiring PW1 are disposed in the same layer.

In the multilayer printed wiring board 30, the reference potential second branch wiring 110-S22 that connects the second drive circuit 100-2 and the fourth semiconductor switch SS4 and the reference potential first branch wiring 110-S21 of the second wiring PW2 are disposed in the same layer.

In the multilayer printed wiring board 30, the control signal second branch wiring 110-G22 that connects the second drive circuit 100-2 and the fourth semiconductor switch SS4 and the control signal first branch wiring 110-G21 of the second wiring PW2 are disposed in the same layer.

In other words, in the multilayer printed wiring board 30, the wiring shape of the reference potential wiring and the wiring shape of the control signal wiring of a portion in which the reference potential wiring and the control signal wiring overlap in the lamination direction AZ match when viewed in the lamination direction of the multilayer printed wiring board 30.

That is, in the reference potential wiring and the control signal wiring connected to one semiconductor switch SS, the shapes of the wiring patterns of these wirings are the same. When it is described that the shapes of wiring patterns are the same, this indicates not only a case in which the shapes are identical to each other but also a case in which wiring widths W of wiring patterns are different and a case in which wirings are disposed with a shift in the X axis direction or the Y axis direction when viewed in the lamination direction of the multilayer printed wiring board 30.

[Laminate Length of Wiring Patterns]

As shown in FIGS. 5A, 5B and 5C, a wiring pattern of the first layer 30-1 and a wiring pattern of the second layer 30-2 and a wiring pattern of the third layer 30-3 and a wiring pattern of the fourth layer 30-4 are disposed such that their positions do not overlap in the lamination direction AZ of the multilayer printed wiring board 30.

At an intersecting portion IS shown in FIG. 5A, the wiring pattern of the first layer 30-1 and the wiring pattern of the second layer 30-2, and the wiring pattern of the third layer 30-3 and the wiring pattern of the fourth layer 30-4 intersect in the lamination direction AZ of the multilayer printed wiring board 30.

Specifically, the first wiring PW1 (the control signal second branch wiring 110-G12 and the reference potential second branch wiring 110-S12) and the second wiring PW2 (the control signal first branch wiring 110-G21 and the reference potential first branch wiring 110-S21) intersect in the lamination direction AZ at the intersecting portion IS.

A wiring pattern of the multilayer printed wiring board 30 is disposed so that, at the intersecting portion IS, the wiring length L at which the wiring pattern of the first wiring PW1 and the wiring pattern of the second wiring PW2, intersect becomes as short as possible.

For example, the intersecting wiring length L is shorter than the wiring length L of a portion in which the reference potential wiring and the control signal wiring of the first wiring PW1 overlap in the lamination direction AZ. In addition, the intersecting wiring length L is shorter than the wiring length L of a portion in which a reference potential wiring and a control signal wiring of the second wiring PW2 overlap in the lamination direction AZ.

As shown in FIG. 5A, when the wiring pattern is disposed so that the first wiring PW1 and the second wiring PW2 are orthogonal to each other at the intersection IS, the intersecting wiring length L is shorter than when the first wiring PW1 and the second wiring PW2 are not orthogonal to each other. Also, when it is described that they are orthogonal to each other, this indicates not only a case in which an angle between wiring patterns is 90[°] but also a case in which an angle other than 90[°], for example, 80[°], is formed.

When the first wiring PW1 and the second wiring PW2 are orthogonal to each other at the intersection IS, the wiring length L1 at the intersection IS of the first wiring PW1 and the wiring width W2 at the intersection IS of the second wiring PW2 are the same. In addition, when the first wiring PW1 and the second wiring PW2 are orthogonal to each other at the intersection IS, the wiring length L2 at the intersection IS of the second wiring PW2 and the wiring width W1 at the intersection IS of the first wiring PW1 are the same.

That is, in a portion in which the first wiring PW1 and the second wiring PW2 overlap in the lamination direction AZ, the wiring length L of one wiring between the first wiring PW1 and the second wiring PW2 and the wiring width W of the other wiring match.

In the upper arm and the lower arm of the semiconductor switch module, operating reference potentials of the semiconductor switch SS and switching operation timings are different.

Specifically, in the first module 10, the upper arm semiconductor switch 10-1 and the lower arm semiconductor switch 10-2 have different reference potentials and switching operation timings. In addition, in the second module 20, the upper arm semiconductor switch 20-1 and the lower arm semiconductor switch 20-2 have different reference potentials and switching operation timings.

When a wiring pattern connected to the upper arm and a wiring pattern connected to the lower arm are disposed close to each other in the multilayer printed wiring board 30, a parasitic capacitance between wirings is greater than when they are disposed apart from each other. Therefore, when a wiring pattern connected to the upper arm and a wiring pattern connected to the lower arm are disposed close to each other, noise caused by charge and discharge currents of a parasitic capacitance generated by potential variation resulting from switching of the semiconductor switch SS increases. An increase in noise adversely influences operation stability of the semiconductor switch SS.

In the power converter 1 of the present embodiment, in the multilayer printed wiring board 30, a wiring pattern connected to the upper arm and a wiring pattern connected to the lower arm are disposed at positions that do not overlap in the lamination direction AZ. That is, in the power converter 1 of the present embodiment, a wiring pattern connected to the upper arm and a wiring pattern connected to the lower arm are disposed apart from each other in the multilayer printed wiring board 30.

Therefore, according to the power converter 1 of the present embodiment, an increase in parasitic capacitance between upper and lower arm wirings is minimized and noise caused by charge and discharge currents of a parasitic capacitance can be reduced. That is, according to the power converter 1 of the present embodiment, it is possible to reduce malfunctions of the semiconductor switch due to noise caused in the wiring pattern of the printed wiring board.

In addition, in the power converter 1 of the present embodiment, the multilayer printed wiring board 30 has a laminate structure. Therefore, according to the power converter 1 of the present embodiment, it is possible to reduce a wiring inductance of the control signal wiring and the reference potential wiring. That is, according to the power converter 1 of the present embodiment, it is possible to reduce malfunctions of the semiconductor switch due to noise caused by a wiring inductance of the printed wiring board.

In addition, in the power converter 1 of the present embodiment, the multilayer printed wiring board 30 is connected to a terminal of the semiconductor switch module via a through hole. Therefore, according to the power converter 1 of the present embodiment, the wiring length between the drive circuit 100 and the semiconductor switch module can be shorter than when the multilayer printed wiring board 30 is not connected via a through hole. That is, according to the power converter 1 of the present embodiment, it is possible to reduce vibration and inductive noise of a gate signal generated when the wiring length between the drive circuit 100 and the semiconductor switch module is long. That is, according to the power converter 1 of the present embodiment, it is possible reduce malfunctions of the semiconductor switch due to vibration and inductive noise of a gate signal.

In addition, in the power converter 1 of the present embodiment, the wiring patterns of the multilayer printed wiring board 30 are wirings with the same length. Therefore, according to the power converter 1 of the present embodiment, it is possible to reduce a transient current imbalance occurring when the plurality of semiconductor switches SS are connected in parallel. That is, according to the power converter 1 of the present embodiment, it is possible to reduce malfunctions of the semiconductor switch due to the transient current imbalance.

While the power converter 1 in which two semiconductor switch modules are arranged in parallel has been described above, the present invention is not limited thereto. For example, the power converter 1 may include three or more semiconductor switch modules in parallel.

In addition, while the power converter 1 wired by the 4-layer multilayer printed wiring board 30 has been described above, the present invention is not limited thereto. For example, the power converter 1 may be wired by a 6-layer multilayer printed wiring board 30 including positive and negative power supply layers.

The embodiments and modifications of the present invention have been described above. However, these embodiments and modifications are only examples and are not intended to limit the scope of the invention. These embodiments and modifications can be implemented in various other forms and various omissions, substitutions, and changes can be made without departing from the spirit of the invention. These embodiments and modifications are included in the scope and spirit of the invention and are included in the invention described in the claims and equivalent thereof.

What is claimed is:

1. A power converter in which a plurality of semiconductor switches are connected to a plurality of drive circuits configured to control states of the semiconductor switches, the power converter comprising:
    a first semiconductor switch;
    a second semiconductor switch whose reference potential is different from a reference potential of the first semiconductor switch;
    a first drive circuit configured to control a state of the first semiconductor switch;
    a second drive circuit configured to control a state of the second semiconductor switch; and
    a multilayer substrate in which a first wiring that connects the first drive circuit and the first semiconductor switch and includes a reference potential wiring and a control signal wiring and a second wiring that connects the second drive circuit and the second semiconductor switch and includes a reference potential wiring and a control signal wiring are disposed, wherein, in the multilayer substrate, the reference potential wiring and the control signal wiring of the first wiring are disposed in different layers at positions overlapping in a substrate lamination direction, the reference potential wiring and the control signal wiring of the second wiring are disposed in different layers at positions overlapping in the lamination direction, and a wiring length of a portion in which the first wiring and the second wiring overlap in the lamination direction is set to be shorter than either a wiring length of a portion in which the reference potential wiring and the control signal wiring of the first wiring overlap in the lamination direction or a wiring length of a portion in which the reference potential wiring and the control signal wiring of the second wiring overlap in the lamination direction.

2. The power converter according to claim 1, further comprising a third semiconductor switch whose reference potential is the same as the reference potential of the first semiconductor switch, wherein the first drive circuit additionally controls a state of the third semiconductor switch, and wherein, in the multilayer substrate, a reference potential wiring that connects the first drive circuit and the third semiconductor switch and the reference potential wiring of the first wiring are disposed in the same layer, and a control signal wiring that connects the first drive circuit and the third semiconductor switch and the control signal wiring of the first wiring are disposed in the same layer.

3. The power converter according to claim 2, further comprising a fourth semiconductor switch whose reference potential is the same as the reference potential of the second semiconductor switch, wherein the second drive circuit additionally controls a state of the fourth semiconductor switch, and wherein, in the multilayer substrate, a reference potential wiring that connects the second drive circuit and the fourth semiconductor switch and the reference potential wiring of the second wiring are disposed in the same layer, a control signal wiring that connects the second drive circuit and the fourth semiconductor switch and the control signal wiring of the second wiring are disposed in the same layer, and the semiconductor switches are disposed in the order of the first semiconductor switch, the second semiconductor switch, the third semiconductor switch, and the fourth semiconductor switch.

4. The power converter according to claim 1, wherein a wiring shape of the reference potential wiring and a wiring shape of the control signal wiring of a portion in which the reference potential wiring and the control signal wiring overlap in the lamination direction match when viewed in the substrate lamination direction.

5. The power converter according to claim 1, wherein, in a portion in which the first wiring and the second wiring overlap in the lamination direction, a wiring length of one wiring between the first wiring and the second wiring is the same as a wiring width of the other wiring.

* * * * *